US008013681B2

(12) United States Patent
Beghini

(10) Patent No.: US 8,013,681 B2
(45) Date of Patent: Sep. 6, 2011

(54) WIDE SPECTRUM RADIO TRANSMIT ARCHITECTURE

(75) Inventor: Kenneth Beghini, Spencerport, NY (US)

(73) Assignee: Harris Corporation, Melbourne, FL (US)

( * ) Notice: Subject to any disclaimer, the term of this patent is extended or adjusted under 35 U.S.C. 154(b) by 153 days.

(21) Appl. No.: 12/535,753

(22) Filed: Aug. 5, 2009

(65) Prior Publication Data

US 2011/0032040 A1 Feb. 10, 2011

(51) Int. Cl.
*H03L 7/00* (2006.01)
(52) U.S. Cl. .................. 331/2; 331/46; 331/49; 331/51; 331/56; 331/60
(58) Field of Classification Search ................ 331/2, 46, 331/49, 51, 56, 60
See application file for complete search history.

(56) References Cited

U.S. PATENT DOCUMENTS

| | | | |
|---|---|---|---|
| 4,024,476 A | 5/1977 | Briggs | |
| 4,700,375 A | 10/1987 | Reed | |
| 5,703,537 A * | 12/1997 | Bland et al. .................. 331/1 A |
| 5,933,058 A * | 8/1999 | Pinto et al. ...................... 331/17 |
| 6,512,801 B1 * | 1/2003 | Ninomiya ...................... 375/316 |
| 6,734,740 B1 * | 5/2004 | Green et al. .................... 331/25 |
| 6,828,863 B2 | 12/2004 | Itkin et al. | |
| 7,113,009 B2 | 9/2006 | Sun et al. | |
| 7,206,565 B2 | 4/2007 | Oh et al. | |
| 7,298,184 B2 | 11/2007 | Angel | |
| 7,548,120 B2 * | 6/2009 | Lam et al. ......................... 331/2 |
| 7,747,237 B2 * | 6/2010 | Ali et al. ........................ 455/260 |
| 2005/0128012 A1 * | 6/2005 | Caresosa et al. ................ 331/57 |
| 2005/0285688 A1 * | 12/2005 | Hirano et al. ................... 331/16 |
| 2006/0286956 A1 * | 12/2006 | Munker et al. ................. 455/313 |
| 2008/0290953 A1 * | 11/2008 | Sandner et al. .................... 331/2 |
| 2009/0088113 A1 * | 4/2009 | Marsili et al. ................. 455/260 |
| 2009/0091398 A1 * | 4/2009 | Satoh et al. ...................... 331/49 |

* cited by examiner

*Primary Examiner* — Joseph Chang
*Assistant Examiner* — Jeffrey Shin
(74) *Attorney, Agent, or Firm* — Fox Rothschild, LLP; Robert J. Sacco

(57) ABSTRACT

A communications device (100) includes a frequency divider circuit (106) having a plurality of frequency division ratios. The device also includes at least one phase-lock loop (PLL) circuit (101, 102, 103, 104, 110, 112) coupled to at least a signal input of the frequency divider circuit. The PLL circuit includes a local oscillator (LO) circuit (104) including a plurality of voltage controlled oscillators (VCOs) having different frequency tuning ranges. The device further includes at least one control input (105) coupled to at least the frequency divider circuit and the PLL circuit for specifying one of the plurality of VCOs and one of the plurality of frequency division ratios of the frequency divider circuit.

18 Claims, 5 Drawing Sheets

WIDE SPECTRUM RADIO TRANSMIT ARCHITECTURE

FIELD OF THE INVENTION

The invention relates to radio transmit architectures, and more specifically to wide spectrum radio transmit architectures.

BACKGROUND

Frequency synthesizer circuits are commonly used as accurate frequency sources in a wide variety of electronic devices, including many types of radio communication systems. A frequency synthesizer generally operates by generating one or more output signals having a frequency related to a frequency of an input reference signal. Typically, such circuits are constructed using a single quartz-controlled reference oscillator combined with a phase-locked loop (PLL) to provide a multitude of output frequencies traceable to the highly stable reference from the oscillator.

A basic PLL frequency synthesizer general operates by using a comparator to compare an input reference signal and a feedback signal to produce an error signal. This error signal is typically low pass filtered and used to drive a voltage-controlled oscillator (VCO) which creates the output signal at an output frequency. The output signal is also directed through a feedback loop. The feedback loop typically includes a programmable frequency divider for controlling the output of the synthesizer and to generate the feedback signal. In operation, if the output frequency drifts, the magnitude of the error signal will increase. The change in the error signal will then drive the frequency in the opposite direction in order to reduce the amount of error. As a result, the output frequency of the output signal is effectively locked to the input reference signal.

In conventional radio communications systems, a basic PLL frequency synthesizer generally cannot operate over a very wide range of frequencies, because the comparators generally have a limited bandwidth and can suffer from aliasing problems. These problems can lead to false locking situations or even the inability to lock. Additionally, it is generally difficult to make a high frequency VCO that reliably operates over a wide range of frequencies. This is due to several factors, but the primary restriction is that the amount of phase noise increases as the frequency range of the VCO is increased. As a result, PLL frequency synthesizers are typically limited for use for operating in a single frequency band to avoid introduction of noise.

SUMMARY

Embodiments of the invention describe wide spectrum radio transmit architectures. In a first embodiment of the invention, a communications device is provided. The device includes a frequency divider circuit having a plurality of frequency division ratios. The device also includes at least one phase-lock loop (PLL) circuit coupled to at least a signal input of the frequency divider circuit, the PLL circuit including a local oscillator (LO) circuit, the LO circuit including a plurality of voltage controlled oscillators (VCOs) having different frequency tuning ranges. The device further includes at least one control input coupled to at least the frequency divider circuit and the PLL circuit for selecting one of the plurality of VCOs and one of the plurality of frequency division ratios.

In a second embodiment of the invention, a communications device is provided. The device includes a modulator for modulating a signal based on a synthesizer signal and a frequency synthesizer for providing the synthesizer signal. The synthesizer includes a frequency divider circuit having an a plurality of frequency division ratios. The synthesizer also includes at least one phase-lock loop (PLL) circuit coupled to at least a signal input of the frequency divider circuit, the PLL circuit including a local oscillator (LO) circuit including a plurality of voltage controlled oscillators (VCOs) having different frequency tuning ranges. The synthesizer further includes at least one control input coupled to at least the frequency divider circuit and the PLL circuit for selecting one of the plurality of VCOs and one of the plurality of frequency division ratios for generating the synthesizer signal.

In a third embodiment of the invention, a method is provided for transmitting a signal using a frequency synthesizer including a phase-locked loop (PLL) circuit having a plurality of voltage controlled oscillators (VCOs) and a frequency divider circuit having a plurality of frequency division ratios. The method includes the steps of receiving an input reference signal for the PLL circuit and one or more control signals and generating at least one error signal in the PLL circuit based on at least the input reference signal and a feedback signal. The method also includes the steps of producing an oscillator signal by coupling one of the plurality of VCOs to the frequency divider circuit based on the control signals and driving the one of the VCOs with the error signal. The method further includes the step of frequency dividing the oscillator signal with the frequency divider circuit by selecting one of the plurality of frequency division ratios based on the control signal and generating the feedback signal based on the oscillator signal.

DETAILED DESCRIPTION

Figure 1:
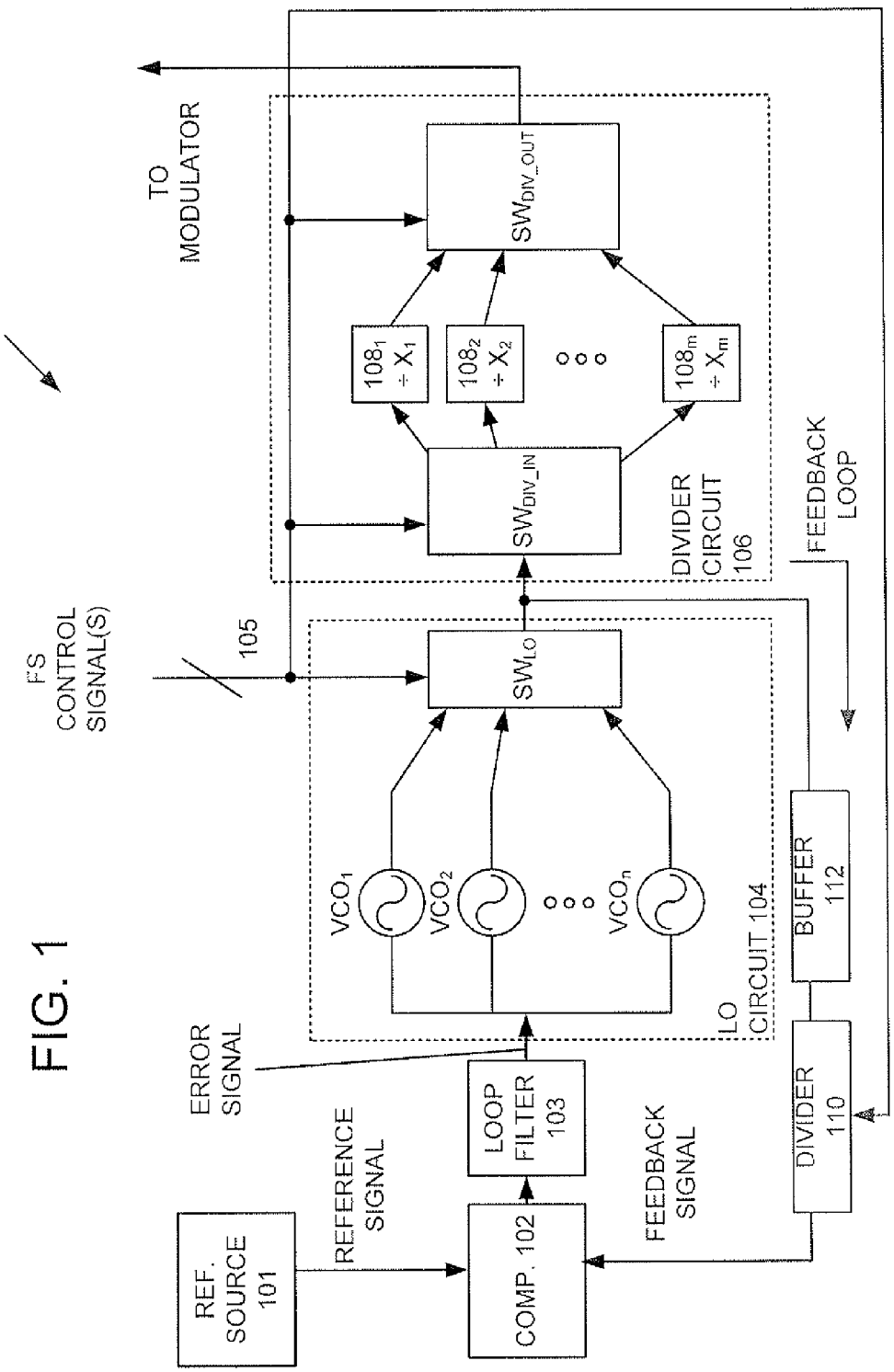
FIG. 1 is a block diagram of a first exemplary frequency synthesizer, having a single PLL circuit, in accordance with an embodiment of the invention.

The invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

As described above, PLL frequency synthesizers are generally configured to support communications in only a single frequency band. As a result, if it is desired for a communications device to support communications in multiple frequency bands, a separate PLL frequency synthesizer is typically needed for each additional frequency band. However, the duplication of PLL frequency synthesizers for each band of interest increases size, weight, and cost of the communications device. For example, in the case of a land mobile radio (LMR), a three band LMR would generally require the use of three VCOs (for the VHF, UHF, and 700/800 MHz bands), three low pass (loop) filters, three frequency dividers, and three comparators to support the four bands. Additionally, other duplicate components, such as buffers and reference signal generators, may also be needed for each band. The duplicate use of such components requires additional space in the LMR and can increase costs significantly, especially if additional bands are needed.

Although a single PLL frequency synthesizer could be used to support multiple band communications in an communications device, the amount of phase noise resulting from such a single PLL frequency synthesizer would generally render the device unusable. The term "phase noise", as used herein, refers to the short term random frequency fluctuations of a signal. In general, phase noise can be minimized as long as the PLL frequency synthesizer can lock. However, when the PLL frequency synthesizer is configured to support a wide range of frequencies, the comparator's limited bandwidth and aliasing problems can lead to the PLL frequency synthesizer improperly locking or failing to lock at all, generating increased phase noise.

Additionally, the range of frequencies supportable by the PLL frequency synthesizer is generally limited by the design of the VCO in the synthesizer. For example, if the VCO is designed to have a high quality factor (Q) value, low phase noise is achieved. However, the tuning bandwidth in such a VCO is generally limited. In contrast, if the Q value of the VCO is low, the tuning bandwidth is increased. However, the phase noise in the VCO is increased.

To overcome the limitations of conventional PLL frequency synthesizer arrangements, embodiments of the invention provide a new PLL-based frequency synthesizer arrangement capable of supporting communications over multiple band and over a wider range of frequencies, as compared to conventional PLL synthesizers. In particular, embodiments of the present invention provide a PLL-based frequency synthesizer using a reduced number of PLL components as compared to conventional PLL frequency synthesizer arrangements. In the various embodiments of the invention, a PLL-based frequency synthesizer arrangement includes a divider circuit or network to enable a limited number of VCOs to support a wide range of frequencies as compared to conventional arrangement. That is, in the various embodiments of the invention, the number of VCOs is less than the number of frequency bands to be supported. To accomplish such a reduction of components, various frequency divider circuits are used to generate multiple ranges of frequencies from a single VCO.

FIG. 1 is a block diagram of a first exemplary frequency synthesizer 100, having a single phase-locked loop (PLL) circuit, in accordance with an embodiment of the invention.

As shown in FIG. 1, the synthesizer 100 includes a comparator 102 that receives a reference signal from a reference source 101 and a feedback signal (to described later). The reference source 101 can be, for example, a crystal oscillator and a frequency divider system. However, the invention is not limited in this regard and other types of sources for generating the reference signal can be used in the various embodiments of the invention. Based on the reference and the feedback signals, the comparator 102 generates an error signal, as described above for conventional PLL frequency synthesizers, which can be low pass filtered using loop filter 103. The error signal is then provided to drive the local oscillator (LO) circuit 104.

As described above, it is typically difficult to find a single VCO capable of supporting a plurality of communications bands and that does not generate a significant amount of phase noise. Therefore, in the various embodiments of the invention the number of VCOs needed to support communications over multiple frequency band can be reduced by the combination of VCOs and an arrangement of frequency divider circuits. In particular, high frequency VCOs and a network of divider circuits is used to derive signals for multiple frequency bands of interest. Although a fewer number of VCOs increases the amount of phase noise present in the output, by using at least one or more divide by 2 ($\div 2$) divider circuits, a $\sim 20*\log(2n)$ dB reduction in phase noise, where n=2i, i is the number of $\div 2$ divider circuits in a path, and i>1, can be achieved in the signal being generated. For example, in the case of one $\div 2$ divider circuit, a $20*\log(2)$ or $\sim 6$ dB reduction in phase noise can be obtained. As the number of $\div 2$ dividers circuits in the path are increased, a further reduction in phase noise is obtained ($\sim 6$ dB for each additional one $\div 2$ divider circuit).

Accordingly, even though a single VCO for multiple frequency bands would normally provide unacceptable levels of phase noise, the combination of divider circuits and VCOs allows two or more VCOs to support communications over a frequency range that typically requires four or more VCOs while still meeting phase noise criteria.

Referring back to FIG. 1, the LO circuit includes two or more VCOs ($VCO_1, VCO_2, \ldots VCO_n$). The number of VCOs and the frequency ranges of these VCOs can be selected such that a minimum number can span the range of interest yet still provide an acceptable amount of phase noise in view of at least one $\div 2$ divider circuit being used. The LO circuit 104 also includes a switch $SW_{LO}$ for selecting which output from $VCO_1, \ldots VCO_n$ to utilize. The switch $SW_{LO}$ can be operated using frequency synthesizer (FS) control signals generated by a controller device (not shown) and provided to at least one control input 105. Once an output is selected at switch $SW_{LO}$, the selected output, an oscillation signal, can be provided to divider circuit 106. The divider circuit 106 then generates the synthesizer signal for transmission or for the communication system coupled to the synthesizer 100.

As shown in FIG. 1, the divider circuit 106 includes an input switch $SW_{DIV\_IN}$ and an output switch $SW_{DIV\_OUT}$. The input switch $SW_{DIV\_IN}$ and the output switch $SW_{DIV\_OUT}$ are used to select a frequency divider path $108_1$, $108_2, \ldots 108_m$ through divider circuit 106. Each of divider paths is associated with a different frequency division ratio ($X_1, X_2, \ldots X_m$). The input switch $SW_{DIV\_IN}$ and the output switch $SW_{DIV\_OUT}$ can also be operated via FS control signals to select one of paths $108_1, 108_2, \ldots 108_m$. As shown in FIG. 1, frequency divider paths $108_1, 108_2, \ldots 108_m$ can each comprise parallel frequency divider elements for frequency dividing the oscillator signal from LO circuit 104 according to their respective frequency division ratios. A "frequency divider element", as used herein, refers to any type of electronic circuit that takes a signal having a first frequency and generates a signal having a second frequency equal to the first frequency divided by the a pre-defined division ratio. However, FIG. 1 illustrates only one exemplary embodiment for divider circuit 106. In other embodiments of the invention, the paths $108_1$, $108_2$, ... $108_m$ can be based on a serial and/or cascaded arrangement of frequency divider elements separated by switches, such that a selection of switches (via FS control signals) selects a path of frequency divider elements which cumulatively provide a frequency ratio for the signal from LO circuit 104. In some embodiments of the invention, a combination of frequency divider elements in parallel, in series, and/or cascaded can be used for defining paths $108_1$, $108_2$, ... $108_m$. The output of the divider circuit 106, the synthesizer signal, is then provided to other components of the transmitter of the communications system, such as a modulator.

In synthesizer 100, the output of the LO circuit 104 is provided to feedback divider 110 for generating a feedback signal for the comparator 102. As described above, the feedback divider 110 is used for selecting the frequency within the range supported by a VCO is to be used, as in a conventional PLL frequency synthesizer. Accordingly, the feedback divider 110 can also be controlled via the FS control signals. The feedback loop through feedback divider 110 can also include a feedback buffer 112 and other components (not shown).

As described above, the LO circuit 104, the divider circuit 106, and the feedback divider 110 are all controlled by the FS control signals. Accordingly, to select a desired output frequency for the output of divider circuit 106, the FS control signals specifies a VCO from LO circuit 104 and a divider path in divider 106. Additionally, the FS control signals specify a division ratio for feedback divider 110, as in a conventional PLL frequency synthesizer. Therefore, in operation of synthesizer 100, a feedback signal is generated for comparator 102 that reflects not only the division ratio for feedback divider 110, but the VCO and divider paths that are currently active. When a different frequency is needed, the FS control signals can be adjusted to modify at least one among the division ratio for feedback divider 110, the VCO in LO circuit 104 to be used, and the divider path in divider 106 to be used. However, even when a same VCO is used for two different frequency bands, the selection of the VCO and the presence of at least one÷2 stage ensures that phase noise criteria is still met.

In FIG. 1, the reference signal source 101, comparator 102, feedback divider 110, and feedback buffer 112 are shown as separate components. However, the embodiments of the invention are not limited in this regard. For example, in some embodiments of the invention, a single component, such as a PLL integrated circuit (IC) that incorporates all of the functions of these components, can be used.

FIG. 1 illustrates a feedback loop for the synthesizer 100 formed by directing the output of LO circuit 104 through feedback buffer 112 and feedback divider 110 to generate feedback signals for comparator 102 to compare with a reference signal provided by reference source 101. In the embodiment illustrated in FIG. 1, even though a number of VCOs can be provided to generate signals at different frequencies, the range of frequencies is typically limited by the division ratio in the reference source 101 (M) and the resulting division ratio of the feedback divider 110 (N). As a result, the useable range of frequencies generated by the VCOs may be limited by these resulting values for M and N. As a result, if a PLL IC with fixed or limited M and N values is used to provide the reference signal source 101, comparator 102, feedback divider 110, and feedback buffer 112, the number and frequency ranges of VCOs usable with the PLL IC may be limited. Consequently, the frequency range of signals provided by frequency synthesizer 100 will also be limited.

Figure 2:
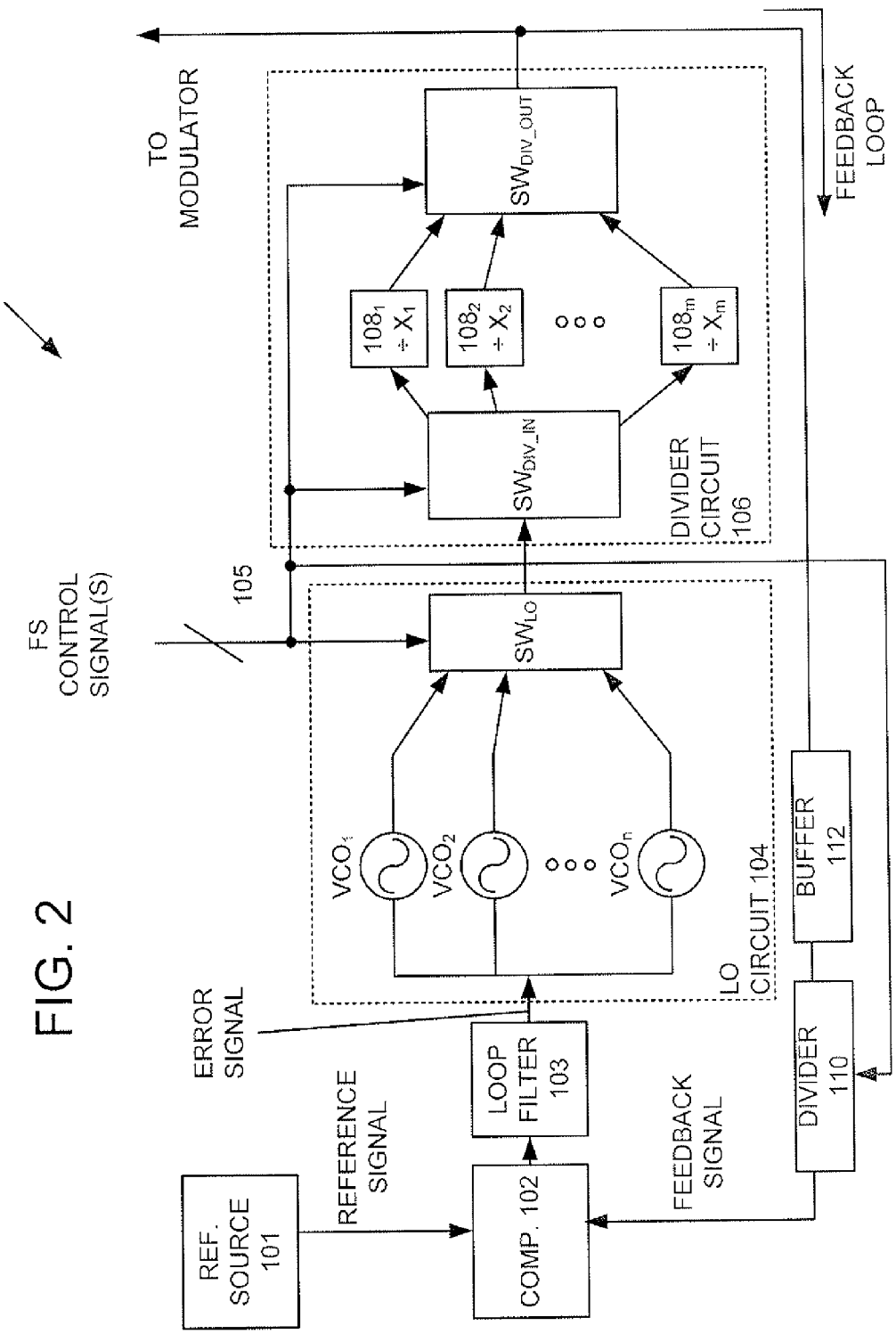
FIG. 2 is a block diagram of a second exemplary frequency synthesizer, having a single PLL circuit, in accordance with another embodiment of the invention.

In order to over this limitation and to provide additional flexibility during design of a frequency synthesizer, the feedback loop can be adjusted in the various embodiments of the invention. In some embodiments, the feedback loop can be provided as shown in FIG. 1, where the feedback signal is obtained based on the output of the LO circuit 104. In other embodiments of the invention, the frequency divider paths can be included in the feedback loop. As a result, the effective value for N is the resulting divider ratio of a selected frequency divider path and the frequency divider in the feedback path. This alternate configuration for the feedback loop is shown in FIG. 2. FIG. 2 is a block diagram of a second exemplary frequency synthesizer 200, also having a single PLL circuit, in accordance with another embodiment of the invention. In general, the arrangement of synthesizer 200 follows that of synthesizer 100. Accordingly, the description above for FIG. 1 is sufficient for generally describing the structure and operation of the synthesizer 200 in FIG. 2.

However, as described above, the feedback loop is instead formed at the output of the divider circuit 106. In these embodiments, FS control signals are still provided to divider circuit 106 for selecting one of paths $108_1$, $108_2$, ... $108_m$ (now outside the feedback loop). As a result, for a selected frequency output of synthesizer 200, the effective value for N will be the division ratio for frequency divider 110 and the division ratio of the selected path $108_i$ ($X_i$). Therefore, if a PLL IC with fixed or limited M and N values is used to provided components reference source 101 and frequency divider 110, the designer can select or design the frequency divider paths 108 to provide the necessary effective N values to allow operation in additional frequency ranges. This allows for more flexibility in choosing the operating frequency for the frequency synthesizer 200.

In the exemplary embodiments shown in FIGS. 1 and 2, a single PLL loop, including the comparator 102, loop filter 104, LO circuit 104, and feedback divider 110 is provided. However, in some instances, each of the VCOs will have different characteristics (i.e., different tuning sensitivity, tuning linearity, VCO load induced drift or "pushing", and VCO power supply induced drift or "pulling"). Therefore, in some embodiments of the invention, performance of the frequency synthesizer can be improved by provided by including separate phase detectors, loop filters, and feedback dividers for each VCO. In such embodiments the VCOs are still coupled to a single divider circuit, but separate PLL loops are provided for driving each VCO. The separate PLL loops can be tuned or tailored for each VCO. Such tuning can improve the VCO output characteristics in the PLL loop, such as lock time or loop bandwidth. Therefore, the overall stability and predictability of the output of the frequency synthesizer is improved. An exemplary configuration including tailored PLL loops for the different VCOs is illustrated in FIG. 3.

Figure 3:
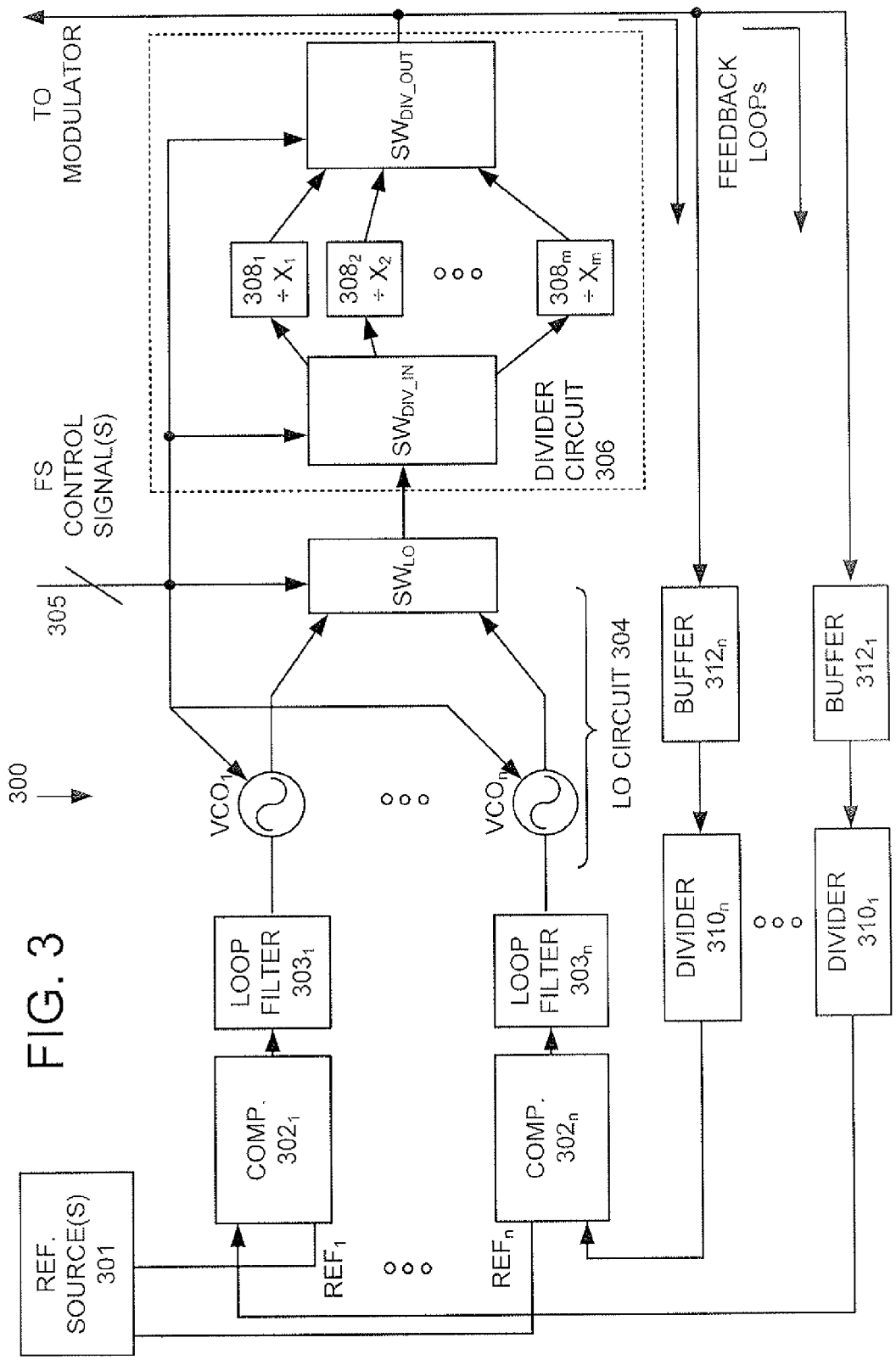
FIG. 3 is a block diagram of a third exemplary frequency synthesizer, having multiple PLL circuits, in accordance with an embodiment of the invention.

FIG. 3 is a block diagram of a third exemplary frequency synthesizer 300, having multiple PLL loops, in accordance with an embodiment of the invention. In contrast to synthesizers 100 and 200, which include a single comparator, loop filter, feedback buffer, and feedback divider, each VCO in synthesizer 300 is associated with a separate comparator, loop filter, feedback buffer, and frequency divider, as shown in FIG. 3.

Referring now to FIG. 3, the synthesizer will include an LO circuit 304 (including $VCO_1$ ... $VCO_n$ and $SW_{LO}$) that provides an output signal to a divider circuit 306 (including frequency divider paths $308_1 \ldots 308_n$) and switches $SW_{DIV\_IN}$ and $SW_{DIV\_OUT}$) controlled by FS control signals provided to at least one control input 305, similar to synthesizer 100 in FIG. 1. However, in synthesizer 300, each of the VCOs (VCO$_1$ ... VCO$_n$) receives an error signal from a corresponding comparator ($302_1 \ldots 302_n$) and an associated loop filter ($303_1 \ldots 303_n$). That is, the error signal for each VCO is generated and filtered using a comparator and filter that are tuned specifically for a corresponding VCO. Such a configuration improves stability of the VCOs, further reducing noise in the output signal from divider circuit 306.

In some embodiments of the invention, each of the comparators 302a ... 302n can receive a same reference signal. However, in other embodiments, the reference signal can also be tuned for a particular VCO. For example, as shown in FIG. 3, the comparators 302a ... 302n can receive different reference signals (e.g., Ref$_1$ ... Ref$_n$). These reference signals can be generated by one or more reference sources.

As described above, in addition to separate comparators and loop filters, synthesizer 300 also includes separate feedback paths for each of VCO$_1$ ... VCO$_n$. As shown in FIG. 3, each feedback path can include a feedback buffer ($312_1 \ldots 312_n$) and a feedback divider ($310_1 \ldots 310_n$) that is tuned specifically for an associated one of VCO$_1$ ... VCO$_n$. In operation, the feedback paths operate in parallel. Therefore, to generate a particular output signal with a particular output frequency, the FS control signals are configured to select a VCO/frequency path combination. The selection of a VCO also effectively selects the feedback path to be used and a locked output signal with the desired output frequency is generated.

Although including multiple PLL loops increases the number of components in a synthesizer, the number of VCOs remains the same. Therefore, number of components is still lower than would be necessary for supporting multiple frequency bands in conventional devices. This results in a reduced cost for the synthesizer, as VCOs are typically the most expensive components in a PLL synthesizer. Additionally, the reduction in the number of VCOs also results in a significant reduction in the size of the synthesizer, as conventional VCOs are generally at least twice as large as other PLL components, such as comparators and loop filters.

In some embodiments of the invention, the parallel operation of the VCOs can cause interference and noise, degrading performance of the frequency synthesizer. Therefore, in some embodiments of the invention, the VCOs currently not in use can be disabled. For example, as shown in FIG. 3, the FS control signals can also generate a VCO enable (or disable) signal. As a result, a particular VCO will only operate (oscillate) only when a VCO/frequency path combination requires the particular VCO. At all other times, the VCO is disabled or turned off, reducing or eliminating possible interference from surrounding VCOs. However, the use of enable/disable signals is not limited to embodiments having multiple PLL loops and can also be used in embodiments having a single PLL loop.

Figure 4:
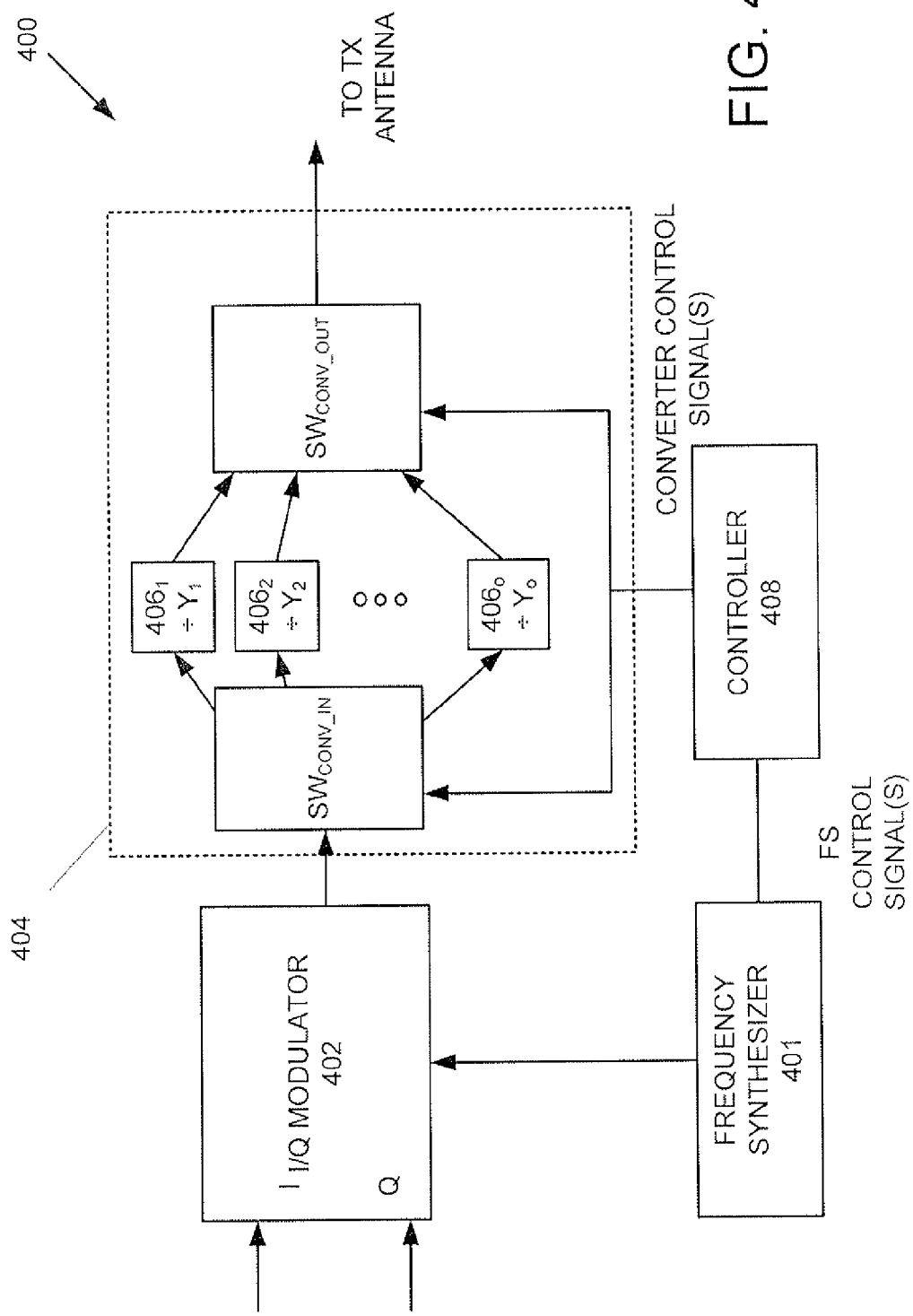
FIG. 4 is a block diagram of a first exemplary transmitter configuration for a radio communications system in accordance with an embodiment of the invention.

A frequency synthesizer in accordance with the various embodiments of the invention can be used with several type of devices, including communications systems. For example, FIG. 4 shows a block diagram of a first exemplary transmitter 400, including a frequency synthesizer 401 in accordance with an embodiment of the invention. As shown in FIG. 4, the transmitter includes a quadrature (I/Q) modulator 402 for modulating in-phase (I) and quadrature (Q) phase signals to an RF frequency signal prior to transmission, based on a signal from frequency synthesizer 401. Although various methods for implementing an I/Q modulator are known to one of ordinary skill in the art, in some embodiments, the design of an I/Q modulator 402 can also be selected to reduce the number of components in the frequency synthesizer. For example, an I/Q modulator typically splits the signal received from a frequency synthesizer into two equal signals. One method of implementing this splitting is by using a÷2 frequency divider element. Accordingly, in some embodiments of the invention, since the signal generated by the frequency synthesizer will undergo at least one division in the modulator, a frequency synthesizer in accordance with an embodiment of the invention can be designed to provide an output signal at twice the frequency of transmission, eliminating the need to include a final divider element to provide output signals at the final transmission frequency. In addition, since a frequency divider element reduces phase noise regardless of its position in the transmission system, any other frequency divider elements in the I/Q modulator can be accounted for when determining the minimum number of VCOs and frequency divider paths needed to meet phase noise criteria for each frequency band. Accordingly, if other divider elements are present in a modulator, the phase noise criteria for the VCOs in the frequency synthesizer can be further relaxed, allowing further reduction in the number of components required.

In some embodiments, the signal output by the modulator can be only an intermediate frequency (IF) signal requiring further conversion prior to transmission. In these embodiments the output of modulator 402 can be directed through an IF to RF converter 404 to adjust a frequency, amplitude, or phase of the IF signal prior to transmission. For example, to enable transmission of both low VHF (30-50 MHz) and high VHF (136-174 MHz) frequency band signals, the same signal may be used by frequency dividing the high VHF signal to obtain the low VHF frequency prior to transmission. In such embodiments, the converter 404 can include at least one frequency divider element.

Accordingly, the converter 404 can be used to extend the frequency range of the frequency synthesizer. In these embodiments, the converter 404 can include converter frequency divider paths $406_1, 406_2, \ldots 406_o$ to further adjust the output frequency prior to transmission. In one embodiment, the configuration of converter 404 can be similar to the configuration of divider circuit 106 in FIG. 1. That is, converter 404 can include input and output switches $SW_{CONV\_IN}$ and $SW_{CONV\_OUT}$ for selecting one of paths $406_1, 406_2, \ldots 406_o$, where each of paths $406_1, 406_2, \ldots 406_o$ is associated with a different division ratio ($Y_1, Y_2, \ldots Y_o$).

As shown in FIG. 4, divider paths $406_1, 406_2, \ldots 406_o$ can each comprise parallel frequency divider elements for frequency dividing the signal from modulator 402 according to an associated frequency division ratio ($Y_1, Y_2, \ldots Y_o$). However, the invention is not limited in this regard. In some embodiments, the paths $406_1, 406_2, \ldots 406_o$ can be based on a serial or cascaded arrangement of frequency divider elements separated by switches, such that a selection of switches selects a path of frequency divider elements which cumulatively provide a desired frequency ratio for the signal from modulator 402. In other embodiments of the invention, a combination of frequency divider elements in parallel, in series, and/or cascaded can be used for defining paths $406_1, 406_2, \ldots 406_o$.

As described above, a frequency divider element reduces phase noise regardless of its position in the transmission system. Therefore, the frequency divider elements in the converter 404 can also be considered when determining the minimum number of VCOs and frequency divider paths needed in the frequency synthesizer 401 to meet phase noise criteria for each frequency band.

As shown in FIG. 4 and as described above with respect to FIG. 1, a controller device 408 can be used to generate FS control signals for the frequency synthesizer 401. Additionally controller device 408 can also be configured to generate converter control signals for converter 404 (if present). Although FIG. 4 shows only a single controller device 408 generating FS control signals and converter control signals, the various embodiments of the invention are not limited in this regard. In some embodiments, the controller device 408 can be implemented as two or more separate devices. In such embodiments, control signal generation tasks can be implemented in centralized or distributed fashion among the separate devices.

The configuration shown in FIG. 4, using the frequency synthesizer in FIG. 1, 2, or 3 can be advantageous in the case of an LMR device. In particular, by implementing the synthesizer in FIG. 1, 2, or 3 using two LO's and frequency divider elements with simple division ratios, low VHF, high VHF, UHF, and 700/800 MHz bands can be supported, especially when the modulator includes a ÷2 frequency divider element. For example, by selecting LO operating frequencies of 1040-1600 MHz and 1600-2080 MHz for the first and second LO's and frequency divider paths having division ratios of 1, 2, 4, and 8, the synthesizer can synthesizer output signals in a frequency range spanning 240 to 1740 MHz. As a result, a modulator including the ÷2 frequency divider element can output signals in a frequency range of 120 to 870 MHz. This range adequately covers the high VHF, UHF, and 700/800 MHz bands. To provide a range to cover the low VHF band, a ÷4 frequency divider element can be selectably coupled to the modulator output, as described above. As a result the output of the synthesizer spanning the frequency range of 240 to 400 MHz can also be used to provide the low VHF output frequency range of 30 to 50 MHz (after the ÷2 frequency divider element in the modulator and the ÷4 frequency divider element at the modulator output).

The various embodiments of the invention are also not limited solely to utilizing the frequency synthesizer for providing an input signal for a modulator. In some embodiments of the invention, the frequency synthesizer can be configured as a PLL transmitter. For example, FIG. 5 shows a block diagram of a second exemplary transmitter 500 in accordance with an embodiment of the invention.

Figure 5:
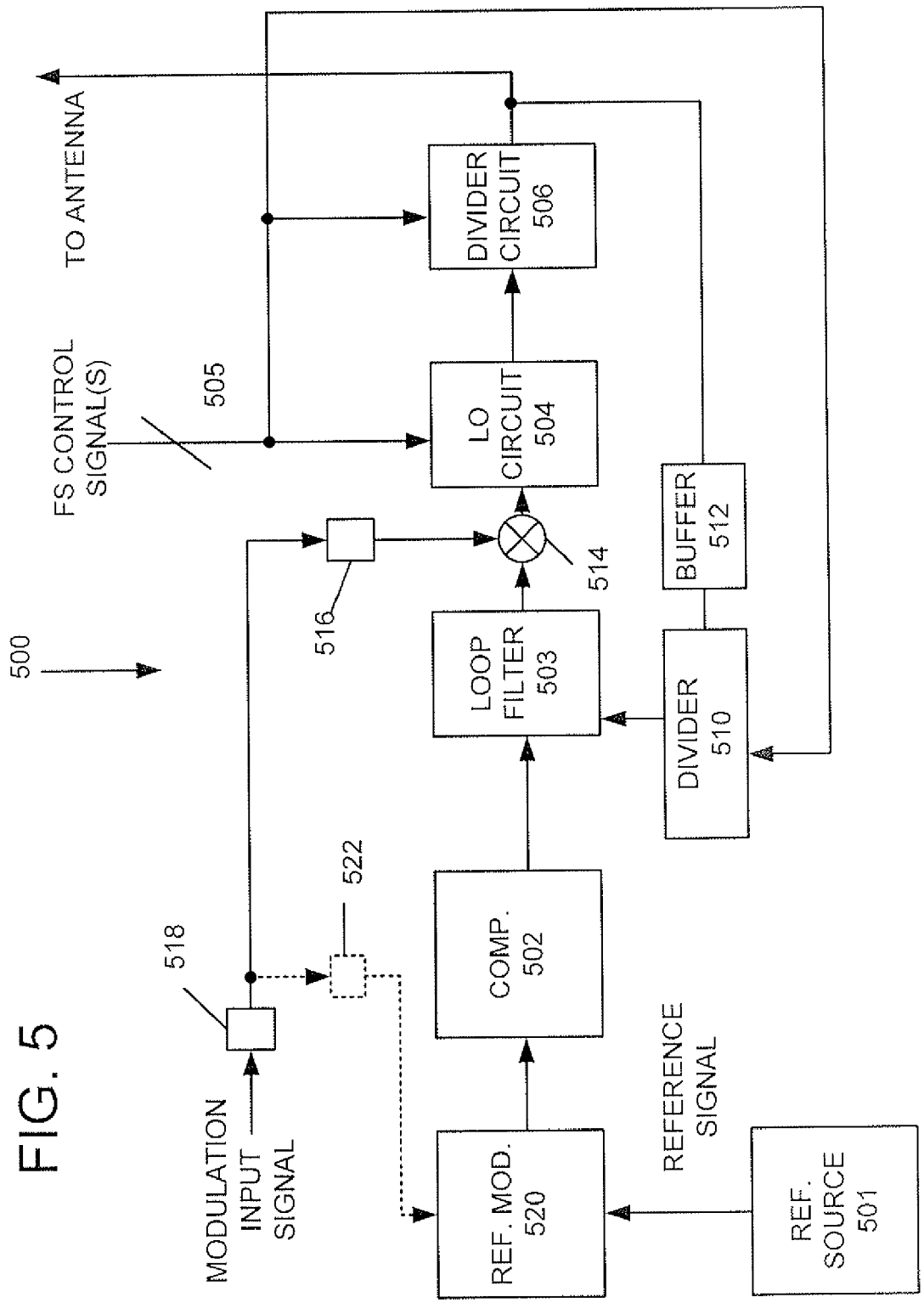
FIG. 5 is a block diagram of a second exemplary transmitter configuration for a radio communications system in accordance with an embodiment of the invention.

The transmitter 500 in FIG. 5 is configured substantially similar to the synthesizer shown in FIG. 1. That is, transmitter 500 includes a reference source 501, a comparator 502, a loop filter 503, an LO circuit 504, at least one control input 505, a divider circuit 506, and a feedback loop including a feedback divider 510 and a feedback buffer 512. Operation of this portion of transmitter 500 is substantially similar to that described in FIG. 1 and the description above is sufficient for describing the basic operation of transmitter 500.

In addition to the components listed above, the transmitter 500 can include a mixer 514, coupling loop filter 503 to LO circuit 504, as shown in FIG. 5. The mixer 514 receives a modulation input signal from a modulation signal source. The modulation input signal represents the information to be included in the carrier output of the divider circuit 506. The information can be represented by variations in phase or frequency in the modulation input signal. For example, frequency modulation (FM) signal or phase-shift keying (PSK) can be used to generate the modulation input signal. However, the invention is not limited in this regard and other types of modulation input signals can also be used. In operation, the modulation input signal is combined at mixer 514 with the output of the loop filter 503. The combination is then used to drive the VCO in LO circuit selected by the FS control signal. As a result, the output of the divider circuit 506 is a carrier encoded with the information in the modulation input signal and can be delivered to an antenna and/or other transmission components.

This configuration of a PLL transmitter effectively operates by generating high-frequency carrier signals synchronized to a substantially lower frequency input reference signal. However, even though such a transmitter will typically follow slow variations (i.e., lower frequencies) of the reference signal, it will not follow fast variations (i.e., higher frequencies), such as noise jitter, in the reference signal. Effectively, this results in the lower frequencies being filtered out of the carrier signal by the PLL loop. However, the higher frequencies are not filtered out, thus modulating the carrier signal with undesired noise jitter. For this reason, it is desirable to use a highly stable reference signal as input to a PLL, since it is undesirable that a reference signal decrease the reliability of the data transmitter by causing modulation of the carrier signal.

Additionally, information signals used to modulate the output of PLL transmitter are typically subject to the same constraints as the reference signal. That is, the high frequency content of the information signal applied to the data transmitter modulates the carrier signal, while the low frequency content is effectively filtered out. While this lack of DC response can be tolerated in some application, there are communications systems that require DC response for proper operation of the data transmitters.

To provide such a DC response for the transmitter in FIG. 5, a dual-port modulation configuration can be used. In particular, a reference modulator 520 can be included between the reference signal source 501 and the comparator 502. Therefore, to produce a modulated output signal with a larger portion of the spectrum of modulation input signal (i.e., provide DC response) from divider circuit 506, the modulation input signal can be simultaneously applied at the reference modulator 520 and at mixer 514. In this manner, the high-pass filtering characteristics of the PLL can be mitigated since the low frequency content of the modulation input signal is effectively "added" to the reference signal by the reference modulator 520. Additional hardware components 516, 518, and 522 can be used to ensure the timing of the modulation input signal at the reference modulator 520 and at mixer 514 are the same.

Although only one dual port configuration is shown in FIG. 5, the embodiments of the invention are not limited in this regard. Rather, the various embodiments of the invention can be used with other PLL transmitter architectures, include architectures with and without a dual port configuration.

Applicants present certain theoretical aspects above that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented.

While various embodiments of the invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A communications device, comprising:
   a frequency divider circuit having a plurality of frequency division ratios;
   at least one phase-lock loop (PLL) circuit coupled to at least a signal input of said frequency divider circuit, said PLL circuit comprising
      a local oscillator (LO) circuit, said LO circuit comprising a plurality of voltage controlled oscillators (VCOs) having different frequency tuning ranges,
      a plurality of loop filter circuits each coupled to a respective one of said plurality of VCOs,
      a plurality of comparators each coupled to a respective one of said plurality of loop filter circuits, and
      a plurality of feedback circuits each coupled to a respective one of said plurality of comparators, and to an input or output of said frequency divider circuit; and
   at least one control input coupled to at least said frequency divider circuit and said PLL circuit for selecting one of said plurality of VCOs and one of said plurality of frequency division ratios.

2. The device of claim 1, wherein said frequency divider circuit comprises a plurality of frequency divider elements coupled to a plurality of switch elements, said plurality of switch elements defining a plurality of frequency divider circuit paths associated with each of said plurality of frequency division ratios based on said control signals at said control input.

3. The device of claim 1, wherein said LO circuit comprises at least one LO switch element coupling one of said plurality of VCOs to said signal input of said frequency divider circuit based on said control signals at said control input.

4. The device of claim 1, wherein said PLL circuit further comprises a mixer coupling a first loop filter of said plurality of loop filters to an LO input of said LO circuit, said mixer providing a combined signal at said LO input based on an output of said first loop filter and a modulation input signal.

5. The device of claim 4, wherein said PLL circuit further comprises:
   a reference source generating an input reference signal for said plurality of comparators; and
   a reference modulator coupling said reference source to said plurality of comparators, said reference modulator providing a combined signal to said plurality of comparators based on said input reference signal and said modulation input signal.

6. The device of claim 1, wherein said LO circuit comprises at least one enable circuit element for enabling one of said plurality of VCOs responsive to said one or more control signals at said control input.

7. The device of claim 1, wherein a number of said plurality of VCOs is less than a number of said plurality of frequency division ratios.

8. A communications device, comprising
   a frequency divider circuit having a plurality of frequency division ratios;
   at least one phase-lock loop (PLL) circuit coupled to at least a signal input of said frequency divider circuit, said PLL circuit comprising a local oscillator (LO) circuit, said LO circuit comprising a plurality of voltage controlled oscillators (VCOs) having different frequency tuning ranges; and
   at least one control input coupled to at least said frequency divider circuit and said PLL circuit for selecting one of said plurality of VCOs and one of said plurality of frequency division ratios;
   wherein said PLL circuit further comprises at least one first PLL loop comprising a loop filter coupled to an LO input of said LO circuit, a comparator coupled to said loop filter circuit, and a PLL feedback circuit coupled to said comparator and to one of a signal output of said frequency divider circuit and said signal input of said frequency divider circuit; and
   wherein said PLL loop is coupled to a first one of said plurality of VCOs, and wherein said PLL circuit further comprises at least a second PLL loop comprising a second loop filter coupled to a second of said plurality of VCOs, a second comparator coupled to said second loop filter circuit, and a second PLL feedback circuit coupled to said second comparator and the one of said signal output and said signal input of said frequency divider circuit.

9. A communications device, comprising:
   a modulator for modulating a signal based on a synthesizer signal; and
   a frequency synthesizer for providing said synthesizer signal, said frequency synthesizer comprising:
      a frequency divider circuit having an a plurality of frequency division ratios,
      at least one phase-lock loop (PLL) circuit coupled to at least a signal input of said frequency divider circuit, said PLL circuit comprising
         a local oscillator (LO) circuit comprising a plurality of voltage controlled oscillators (VCOs) having different frequency tuning ranges,
         a plurality of loop filter circuits each coupled to a respective one of said plurality of VCOs,
         a plurality of comparators each coupled to a respective one of said plurality of loop filter circuits, and
         a plurality of feedback circuits each coupled to a respective one of said plurality of comparators, and to an input or output of said frequency divider circuit; and
   at least one control input coupled to at least said frequency divider circuit and said PLL circuit for selecting one of said plurality of VCOs and one of said plurality of frequency division ratios for generating said synthesizer signal.

10. The device of claim 9, wherein said frequency divider circuit comprises a plurality of frequency divider elements coupled to a plurality of switch elements, said plurality of switch elements defining a plurality of frequency divider circuit paths associated with each of said plurality of frequency division ratios based on said control signals at said control input.

11. The device of claim 9, wherein said LO circuit comprises at least one LO switch element coupling one of said plurality of VCOs to said signal input of said frequency divider circuit based on said control signals at said control input.

12. The device of claim 9, wherein said modulator comprises an I/Q modulator for modulating an in-phase (I) and quadrature phase (Q) signal into an output signal based on said synthesizer signal.

13. A communication device, comprising
a modulator for modulating a signal based on a synthesizer; and
a frequency synthesizer for providing said synthesizer signal, said synthesizer comprising:
  a frequency divider circuit having a plurality of frequency division ratios,
  at least one phase-lock loop (PLL) circuit coupled to at least a signal input of said frequency divider circuit, said PLL circuit comprising a local oscillator (LO) circuit comprising a plurality of voltage controlled oscillators (VCOs) having different frequency tuning ranges, and
  at least one control input coupled to at least said frequency divider circuit and said PLL circuit selecting one of said plurality of VCOs and one of said plurality of frequency division ratios for generating said synthesizer signal;
wherein said PLL circuit further comprising at least one PLL loop comprising a loop filter coupled to an LO input of said LO circuit, a comparator coupled to said loop filter circuit, and a PLL feedback circuit coupled to said comparator and to one of a signal output of said frequency divider circuit and said signal input of said frequency divider circuit; and
wherein said one PLL loop is coupled to a first of said plurality of VCOs, and wherein said PLL circuit further comprises at least a second PLL loop comprising a second loop filter coupled to a second of said plurality of VCOs, a second comparator coupled to said second loop filter circuit, and a second PLL feedback circuit coupled to said second comparator and the one of said signal output and said signal input of said frequency divider circuit.

14. A communications device, comprising
a modulator for modulating a signal based on a synthesizer signal;
a frequency synthesizer for providing said synthesizer signal, said synthesizer comprising:
  a frequency divider circuit having a plurality of frequency division ratios,
  at least one phase-lock loop (PLL) circuit coupled to at least a signal input of said frequency divider circuit, said PLL circuit comprising a local oscillator (LO) circuit comprising a plurality of voltage controlled oscillators (VCOs) having different frequency tuning ranges, and
  at least one control input coupled to at least said frequency divider circuit and said PLL circuit for selecting one of said plurality of VCOs and one of said plurality of frequency division ratios for generating said synthesizer signal; and
an intermediate frequency to radio frequency (IF/RF) converter, said IF/RF converter comprising an output frequency divider circuit having an adjustable frequency division ratio.

15. A method of transmitting a signal using a frequency synthesizer comprising a phase locked loop (PLL) circuit having a plurality of voltage controlled oscillators (VCOs) and a frequency divider circuit having a plurality of frequency division ratios, the method comprising:
  receiving, at each of a plurality of comparators, an input reference signal for said PLL circuit and a respective one of a plurality of feedback signals, each of said plurality of comparators coupled to a respective VCO of said plurality of VCOs via a respective loop filter of a plurality of loop filters;
  generating at least one error signal in said PLL circuit based on at least said input reference signal and one of said plurality of feedback signals;
  producing an oscillator signal by coupling a first VCO of said plurality of VCOs to said frequency divider circuit based on at least one control signal and driving said first VCO with said error signal;
  frequency dividing said oscillator signal with said frequency divider circuit by selecting one of said plurality of frequency division ratios based on said control signal;
  generating said plurality of feedback signals based on said oscillator signal.

16. The method of claim 15, wherein said generating said error signal is further based on a modulation input signal.

17. The method of claim 16, wherein said receiving said input reference signal further comprises:
  generating said input reference signal; and
  combining said input reference signal and said modulation input signal.

18. The method of claim 15, wherein said first VCO is coupled to said frequency divider circuit by enabling said first VCO responsive to said control signal.

* * * * *